(12) United States Patent
Yeh et al.

(10) Patent No.: US 11,011,666 B2
(45) Date of Patent: May 18, 2021

(54) OPTOELECTRONIC SEMICONDUCTOR STRUCTURE HAVING A BIPOLAR PHOTOTRANSISTOR STRUCTURE AND MANUFACTURING METHOD THEREOF

(71) Applicant: National Taiwan University of Science and Technology, Taipei (TW)

(72) Inventors: Ping-Hui Yeh, Taipei (TW); Teng-Po Hsu, Taipei (TW); Yen-Chieh Chiu, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 0 days.

(21) Appl. No.: 16/541,156

(22) Filed: Aug. 15, 2019

(65) Prior Publication Data

US 2020/0058822 A1 Feb. 20, 2020

Related U.S. Application Data

(60) Provisional application No. 62/764,647, filed on Aug. 15, 2018.

(51) Int. Cl.
*H01L 31/12* (2006.01)
*H01L 31/11* (2006.01)
*H01L 31/18* (2006.01)
*H01L 31/0352* (2006.01)
*H01L 31/0304* (2006.01)

(52) U.S. Cl.
CPC ........ *H01L 31/12* (2013.01); *H01L 31/03044* (2013.01); *H01L 31/035236* (2013.01); *H01L 31/1105* (2013.01); *H01L 31/1856* (2013.01)

(58) Field of Classification Search
CPC ........... H01L 31/1105; H01L 31/03044; H01L 31/035236; H01L 31/1856; H01L 31/12
See application file for complete search history.

(56) References Cited

U.S. PATENT DOCUMENTS

| | | | | |
|---|---|---|---|---|
| 4,800,262 A | * | 1/1989 | Lentine | B82Y 20/00 250/214 LS |
| 4,985,621 A | * | 1/1991 | Aull | G02F 3/028 250/214 LS |
| 5,311,047 A | * | 5/1994 | Chang | H01L 31/1105 257/187 |

(Continued)

*Primary Examiner* — Vongsavanh Sengdara
(74) *Attorney, Agent, or Firm* — JCIPRNET

(57) ABSTRACT

An optoelectronic semiconductor structure includes a first n-type semiconductor layer, a first quantum well layer, a first p-type semiconductor layer, and a second n-type semiconductor layer. The first quantum well layer is disposed on the first n-type semiconductor layer. The first p-type semiconductor layer is disposed on the first quantum well layer. The second n-type semiconductor layer is disposed on the first p-type semiconductor layer. The second n-type semiconductor layer includes both an n-type dopant and a p-type dopant. The concentration of the n-type dopant in the second n-type semiconductor layer is greater than the concentration of the p-type dopant in the second n-type semiconductor layer. The first n-type semiconductor layer, the first quantum well layer, the first p-type semiconductor layer, and the second n-type semiconductor layer form a bipolar phototransistor structure. A manufacturing method of the optoelectronic semiconductor structure is also provided.

6 Claims, 7 Drawing Sheets

(56) References Cited

U.S. PATENT DOCUMENTS

| | | | | |
|---|---|---|---|---|
| 5,399,880 A | * | 3/1995 | Chand | B82Y 20/00 |
| | | | | 257/184 |
| 5,414,282 A | * | 5/1995 | Ogura | H01L 31/12 |
| | | | | 257/187 |
| 6,137,123 A | * | 10/2000 | Yang | H01L 31/03046 |
| | | | | 257/184 |

* cited by examiner

OPTOELECTRONIC SEMICONDUCTOR STRUCTURE HAVING A BIPOLAR PHOTOTRANSISTOR STRUCTURE AND MANUFACTURING METHOD THEREOF

CROSS-REFERENCE TO RELATED APPLICATION

This application claims the priority benefit of U.S. provisional application Ser. No. 62/764,647, filed on Aug. 15, 2018. The entirety of the above-mentioned patent application is hereby incorporated by reference herein and made a part of this specification.

BACKGROUND OF THE INVENTION

1. Field of the Invention

The invention generally relates to an optoelectronic semiconductor structure and a manufacturing method thereof.

2. Description of Related Art

The responsivity of commercial ultraviolet sensors is usually low, but the application of ultraviolet light-emitting diode (UV-LED) becomes wider and wider, and the wavelength of the light becomes shorter; for example, UV-B and UV-C are used. UV-LEDs have been widely applied in various fields such as epoxy curing, sterilization, and water purification.

It is necessary to protect human from UV, so that developing an UV sensor with high responsivity is very important. A phototransistor is a kind of optical sensor capable of generating a photocurrent gain, and is manufactured with a special wafer for epitaxy of a phototransistor by conventional arts. Therefore, a conventional phototransistor has a high cost and is unable to be integrated with a light source.

SUMMARY OF THE INVENTION

Accordingly, the invention is directed to an optoelectronic semiconductor structure, which has high responsivity and a low cost.

The invention is directed to a manufacturing method of an optoelectronic semiconductor structure, which has a simple process and a low cost, and can manufacture an optoelectronic semiconductor structure with high responsivity.

An embodiment of the invention provides an optoelectronic semiconductor structure including a first n-type semiconductor layer, a first quantum well layer, a first p-type semiconductor layer, and a second n-type semiconductor layer. The first quantum well layer is disposed on the first n-type semiconductor layer. The first p-type semiconductor layer is disposed on the first quantum well layer. The second n-type semiconductor layer is disposed on the first p-type semiconductor layer. The second n-type semiconductor layer includes both an n-type dopant and a p-type dopant. The concentration of the n-type dopant in the second n-type semiconductor layer is greater than the concentration of the p-type dopant in the second n-type semiconductor layer. The first n-type semiconductor layer, the first quantum well layer, the first p-type semiconductor layer, and the second n-type semiconductor layer form a bipolar phototransistor structure.

An embodiment of the invention provides a manufacturing method of an optoelectronic semiconductor structure including: forming a first semiconductor stack including a first n-type semiconductor layer, a first quantum well layer, and a first p-type semiconductor layer stacked on a substrate in sequence; and diffusing an n-type dopant into a top of the first p-type semiconductor layer to convert the top of the first p-type semiconductor layer into a second n-type semiconductor layer.

The optoelectronic semiconductor structure according to the embodiment of the invention has two n-type semiconductor layers, a p-type semiconductor layer therebetween, and a quantum well layer to form a phototransistor structure, so that the optoelectronic semiconductor structure can have high responsivity to light. Moreover, the optoelectronic semiconductor structure according to the embodiment of the invention adopts the second n-type semiconductor, and the concentration of the n-type dopant in the second n-type semiconductor layer is greater than the concentration of the p-type dopant in the second n-type semiconductor layer, so that the optoelectronic semiconductor structure may be formed from a light-emitting diode or photodiode structure. Therefore, the optoelectronic semiconductor structure according to the embodiment of the invention has a low cost.

In the manufacturing method of the optoelectronic semiconductor structure according to the embodiment of the invention, since an n-type dopant is diffused into the top of the first p-type semiconductor layer to convert the top of the first p-type semiconductor layer into a second n-type semiconductor layer, the optoelectronic semiconductor structure may be formed from a light-emitting diode or photodiode structure so as to reduce the cost of the optoelectronic semiconductor structure, and a phototransistor structure may be formed so as to achieve high responsivity to light.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
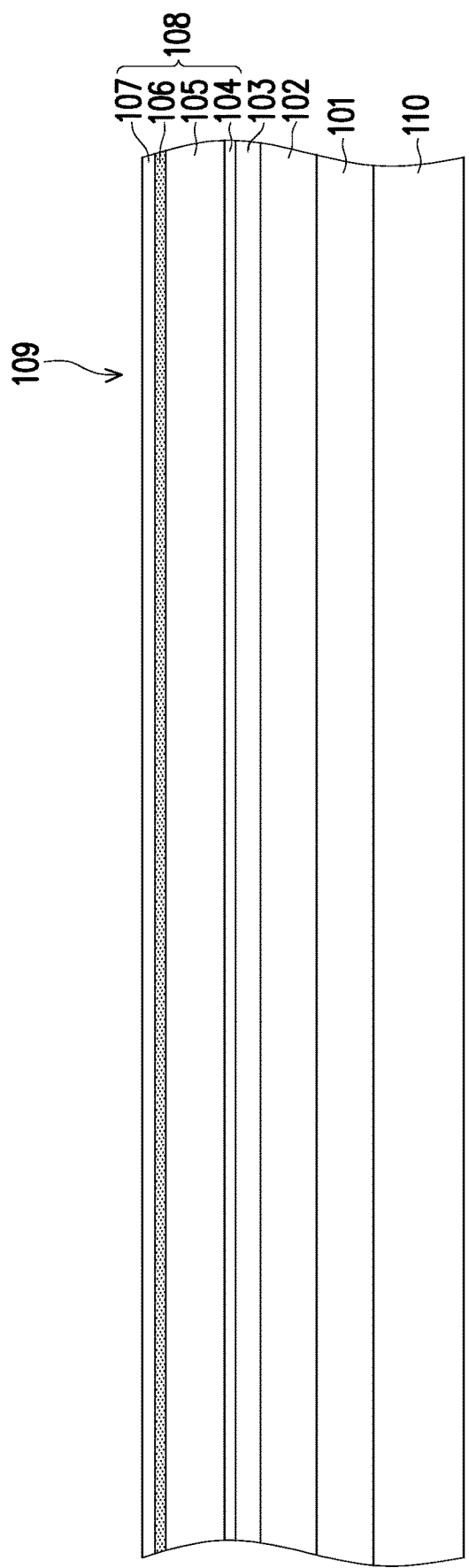
FIG. 1A to FIG. 1F are schematic cross-sectional views respectively showing steps of a manufacturing method of an optoelectronic semiconductor structure according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1F are schematic cross-sectional views respectively showing steps of a manufacturing method of an optoelectronic semiconductor structure according to an embodiment of the invention. Referring to FIG. 1A first, a stack 109 is formed on a substrate 110, wherein the stack 109 includes an n-type semiconductor layer 102, a quantum well layer 103, and a p-type semiconductor layer 108 formed on the substrate 110 in sequence. In this embodiment, the substrate 110 is a sapphire substrate, for example, a patterned sapphire substrate. However, in other embodiments, the substrate 110 may be made of any other appropriate material.

In this embodiment, the stack 109 further includes an undoped semiconductor layer 101, wherein the undoped semiconductor layer 101 is formed between the substrate 110 and the n-type semiconductor layer 102. Moreover, the p-type semiconductor layer 108 includes a p-type electron blocking layer 104, a p-type semiconductor layer 105, a p-type semiconductor cap 106, and a p-type semiconductor contact layer 107 (i.e. a p+ semiconductor layer that has high hole concentration and enables an Ohmic contact between metal and p-type semiconductor) formed in sequence from the quantum well layer 103. In other embodiments, the p-type semiconductor layer 108 may have no p-type electron blocking layer 104.

The n-type semiconductor layer 102, the quantum well layer 103, the p-type semiconductor layer 105 may be made of nitride. In this embodiment, the undoped semiconductor layer 101 is made of undoped gallium nitride (GaN), and the n-type semiconductor layer 102 is made of n-type GaN. The quantum well layer 103 is a multiple quantum well layer, which includes a plurality of relatively small bandgap nitride, e.g. indium gallium nitride (InGaN) layers, and a plurality of relatively large bandgap nitride, e.g. aluminum gallium nitride (AlGaN) layers, stacked alternately from the n-type semiconductor layer 102. In other embodiments, the multiple quantum well layer may include InGaN layers and GaN layers stacked alternately or two other semiconductor materials stacked alternately, which depends on the waveband of light being sensed.

The p-type electron blocking layer 104 may be made of p-type AlGaN, but the invention is not limited thereto. The p-type semiconductor layer 105 may be made of p-type AlGaN, the p-type semiconductor cap 106 may be made of p-type GaN, and the p-type semiconductor contact layer 107 may be made of p-type InGaN, but the invention is not limited thereto. In other embodiments, the p-type semiconductor layer 105 may be made of p-type GaN or of the same material as the p-type electron blocking layer 104.

Figure 1B:
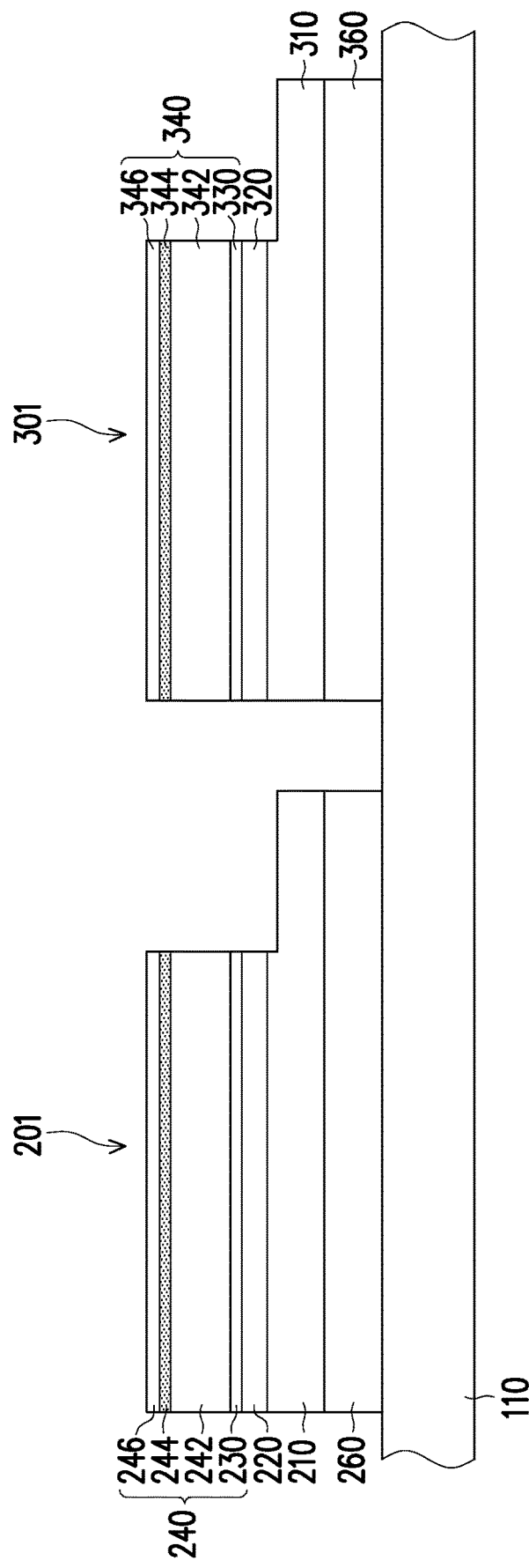

Then, referring to FIG. 1B, the stack 109 is divided into the first semiconductor stack 201 and a second semiconductor stack 301. For example, the stack 109 is isolated to form the first semiconductor stack 201 and the second semiconductor stack 301 by a deep etch down to the substrate 110. The deep etch is performed by inductively coupled plasma reactive-ion etching (ICP-RIE), for example. Moreover, a mesa structure of the first semiconductor stack 201 and a mesa structure of the second semiconductor stack 301 are formed. The first semiconductor stack 201 includes a first n-type semiconductor layer 210, a first quantum well layer 220, and a first p-type semiconductor layer 240 stacked on a substrate in sequence. The second semiconductor stack 340 includes a third n-type semiconductor layer 310, a second quantum well layer 320, and a second p-type semiconductor layer 340 stacked on the substrate 110 in sequence. The n-type semiconductor layer 102 is divided into the first n-type semiconductor layer 210 and the third n-type semiconductor layer 310. The quantum well layer 103 is divided into the first quantum well layer 220 and the second quantum well layer 320. The p-type semiconductor layer 108 is divided into the first p-type semiconductor layer 240 and the second p-type semiconductor layer 340. As a result, the materials of the first n-type semiconductor layer 210, the first quantum well layer 220, and the first p-type semiconductor layer 240 are respectively the same as the materials of the third n-type semiconductor layer 310, the second quantum well layer 320, and the second p-type semiconductor layer 340.

In this embodiment, the first semiconductor stack 201 further includes an undoped semiconductor layer 260, wherein the undoped semiconductor layer 260 is disposed between the substrate 110 and the first n-type semiconductor layer 210. The first p-type semiconductor layer 240 includes a p-type electron blocking layer 230, a p-type semiconductor layer 242, a p-type semiconductor cap 244, and a p-type semiconductor contact layer 246 formed in sequence from the first quantum well layer 220. In this embodiment, the p-type electron blocking layer 230 is disposed right on the first quantum well layer 220. Moreover, in this embodiment, the second semiconductor stack 301 further includes an undoped semiconductor layer 360, wherein the undoped semiconductor layer 360 is disposed between the substrate 110 and the first n-type semiconductor layer 310. The second p-type semiconductor layer 340 includes a p-type electron blocking layer 330, a p-type semiconductor layer 342, a p-type semiconductor cap 344, and a p-type semiconductor contact layer 346 formed in sequence from the second quantum well layer 320.

In addition, the undoped semiconductor layer 101 is divided into the undoped semiconductor layer 260 and the undoped semiconductor layer 360. The p-type electron blocking layer 104 is divided into the p-type electron blocking layer 230 and the p-type electron blocking layer 330. The p-type semiconductor layer 105 is divided into the p-type semiconductor layer 242 and the p-type semiconductor layer 342. The p-type semiconductor cap 106 is divided into the p-type semiconductor cap 244 and the p-type semiconductor cap 344. The p-type semiconductor contact layer 107 is divided into the p-type semiconductor contact layer 246 and the p-type semiconductor contact layer 346.

Figure 1C:
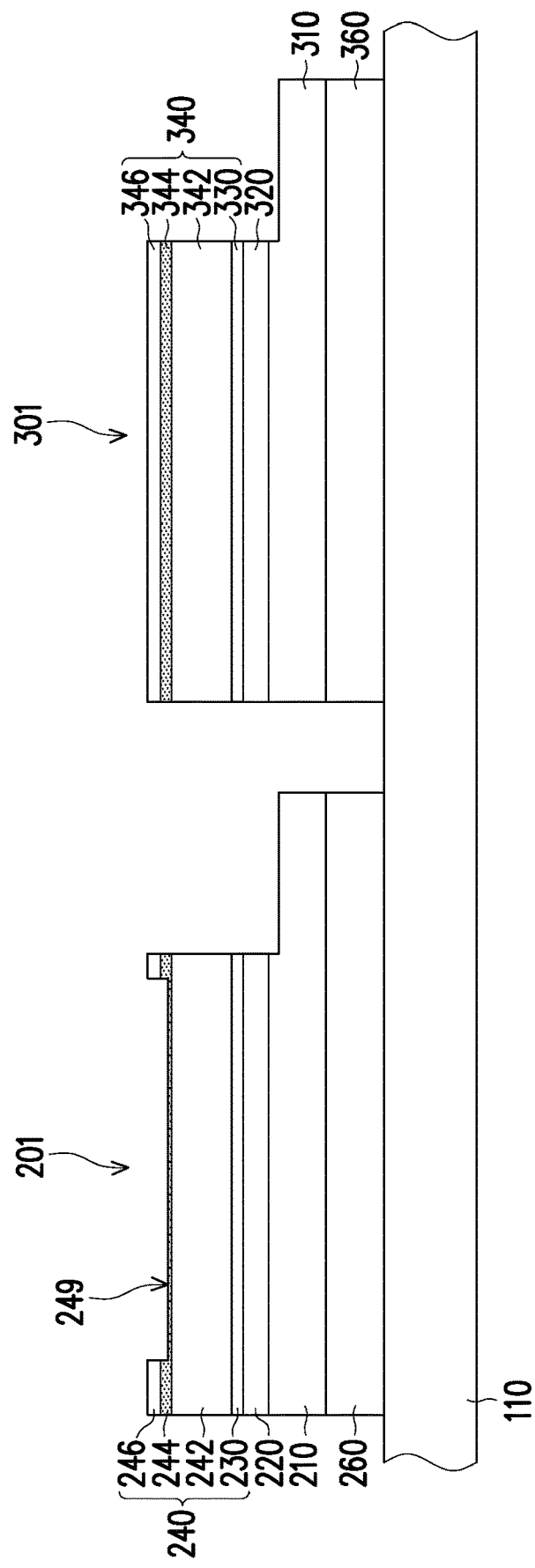

Next, referring to FIG. 1C, a part of the first p-type semiconductor layer 240 at the top of the first p-type semiconductor layer 240 is removed and thus an empty region 249 is formed. In this embodiment, the p-type semiconductor contact layer 246 and at least a part of the p-type semiconductor cap 244 are removed. The removal of the part of the first p-type semiconductor layer 240 at the top of the first p-type semiconductor layer 240 may be performed by ICP-RIE, and deep level traps may be formed in the p-type electron blocking layer 230 in this step. In other embodiments, the first p-type semiconductor layer 240 may have no p-type semiconductor contact layer 246, and at least a part of the p-type semiconductor cap 244 is removed.

Figure 1D:
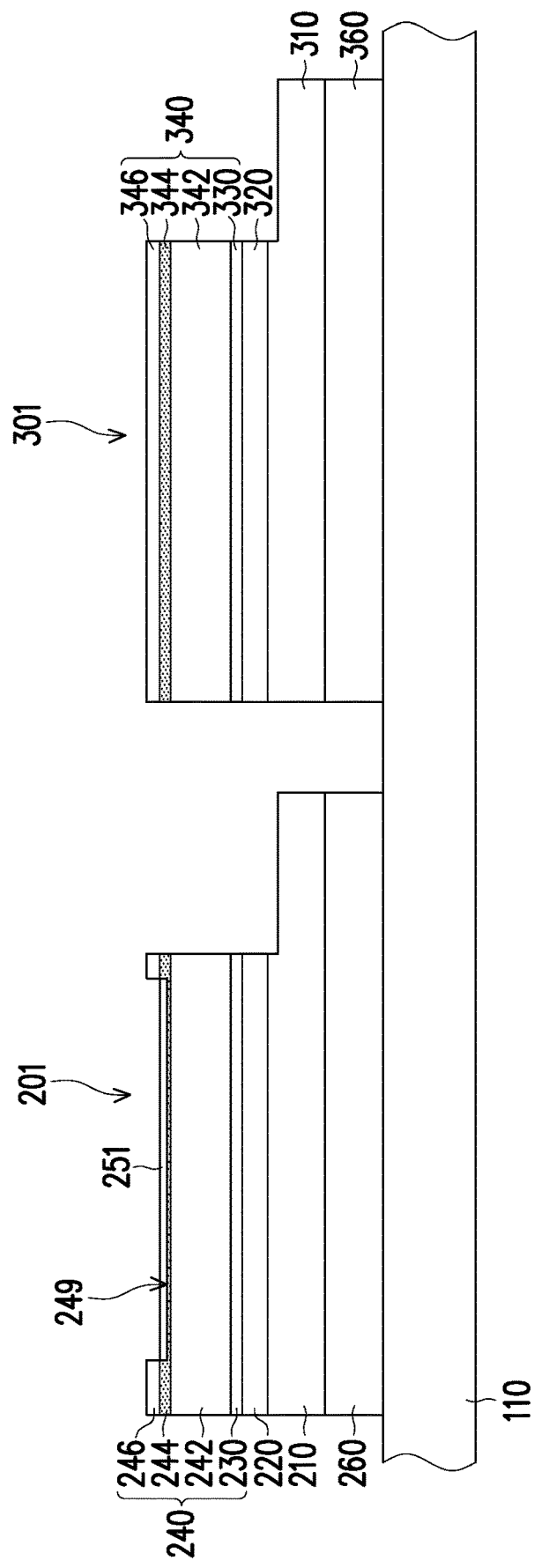
Figure 1E:
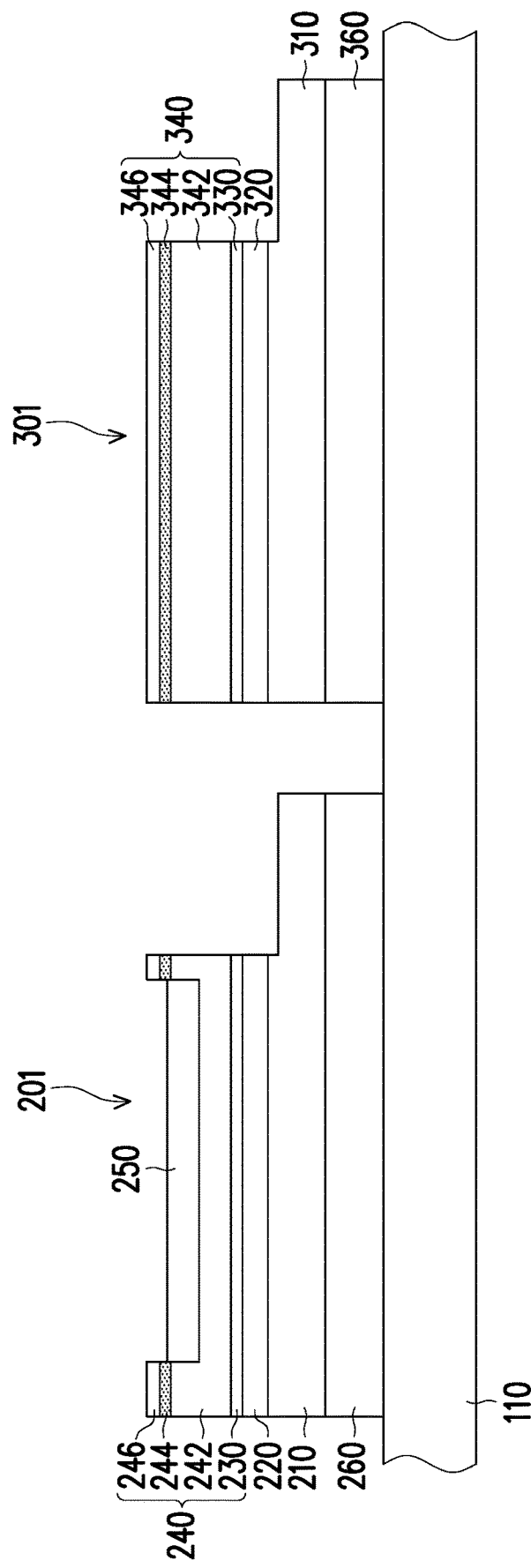

Afterwards, referring to FIG. 1D and FIG. 1E, an n-type dopant is diffused into the top of the first p-type semiconductor layer 240 beneath the region 249 to convert the top of the first p-type semiconductor layer 240 into a second n-type semiconductor layer 250 as shown in FIG. 1E. The step of diffusing the n-type dopant into the top of the first p-type semiconductor layer 240 includes the steps as follows. First, referring to FIG. 1D, a thin n-type dopant film 251 of 20-200 nm in thickness is formed on the top of the first p-type semiconductor layer 240. For example, in this embodiment, the thin n-type dopant film 251 is deposited in the region 249 on the top of the first p-type semiconductor layer 240 by using an electron beam evaporator, and the thin n-type dopant film 215 is a thin silicon film.

Then, the thin n-type dopant film 215 and the first p-type semiconductor layer 240 is heated to diffuse the n-type dopant from the thin n-type dopant film 215 into the top of the first p-type semiconductor layer 240. For example, the thin n-type dopant film 215 and the first p-type semiconductor layer 240 may be heated by rapid thermal annealing. As a result, the top of the first p-type semiconductor layer 240 is converted into the second n-type semiconductor layer 250 as shown in FIG. 1E, and the concentration of the n-type dopant in the second n-type semiconductor layer is greater than the concentration of the p-type dopant in the second n-type semiconductor layer 250. Any residual n-type dopant film on the wafer surface needs to be removed after diffusion. In this embodiment, the p-type electron blocking layer 230 in the region beneath the second n-type semiconductor layer 250 has the deep level traps.

After that, passivation layers 290 and 390 are formed on the first semiconductor stack 201 and the second semiconductor stack 301, respectively. Moreover, electrodes 270 and 280 are respectively formed on the second n-type semiconductor layer 250 and the first n-type semiconductor layer 210. Besides, an ohmic contact layer 350 and an electrode 370 are formed on the p-type semiconductor contact layer 346 in sequence, and an electrode 380 is formed on the third n-type semiconductor layer 310. The electrodes 270 and 280 are respectively electrically connected to the second n-type semiconductor layer 250 and the first n-type semiconductor layer 210, and the electrodes 370 and 380 are respectively electrically connected to the second p-type semiconductor layer 340 and the third n-type semiconductor layer 310. Consequently, the processed first semiconductor stack 201, the electrodes 270 and 280, and the passivation layer 290 form a bipolar phototransistor structure 200, and the second semiconductor stack 301, the ohmic contact layer 350, the electrodes 370 and 380, and the passivation layer 390 form a light-emitting diode or photodiode structure 300. In this way, the bipolar phototransistor structure 200 and the light-emitting diode or photodiode structure 300 are monolithically integrated on the substrate 110.

Figure 1F:
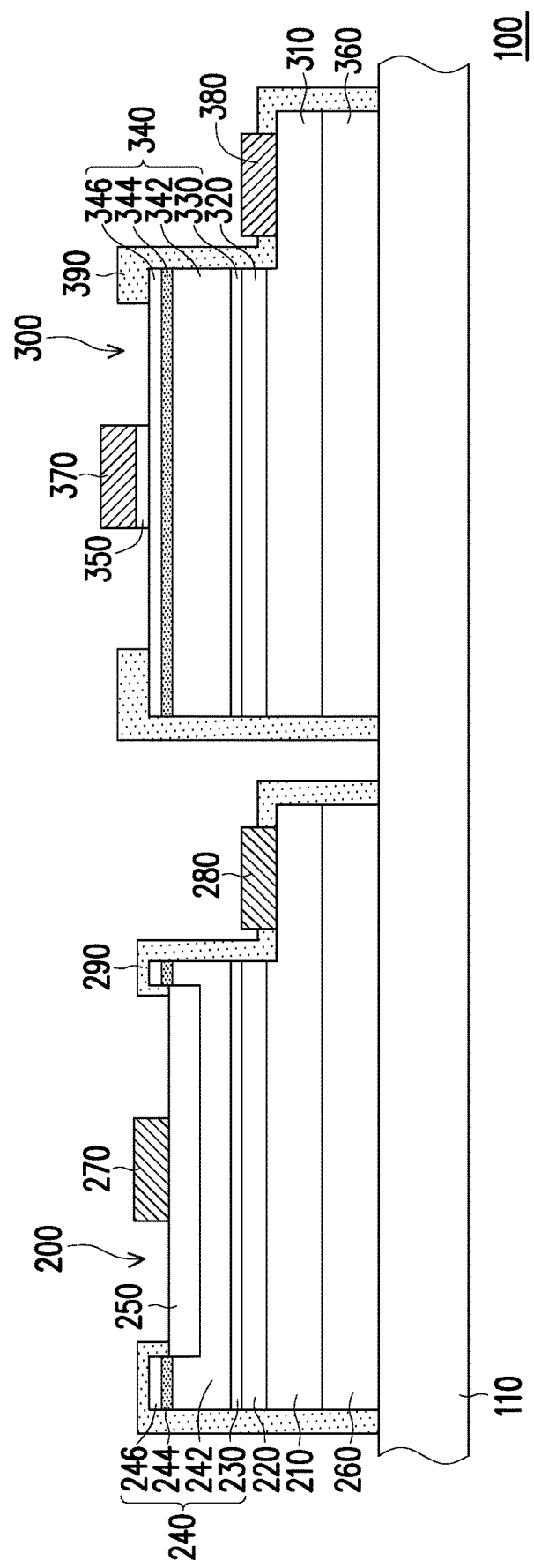
Figure 2:
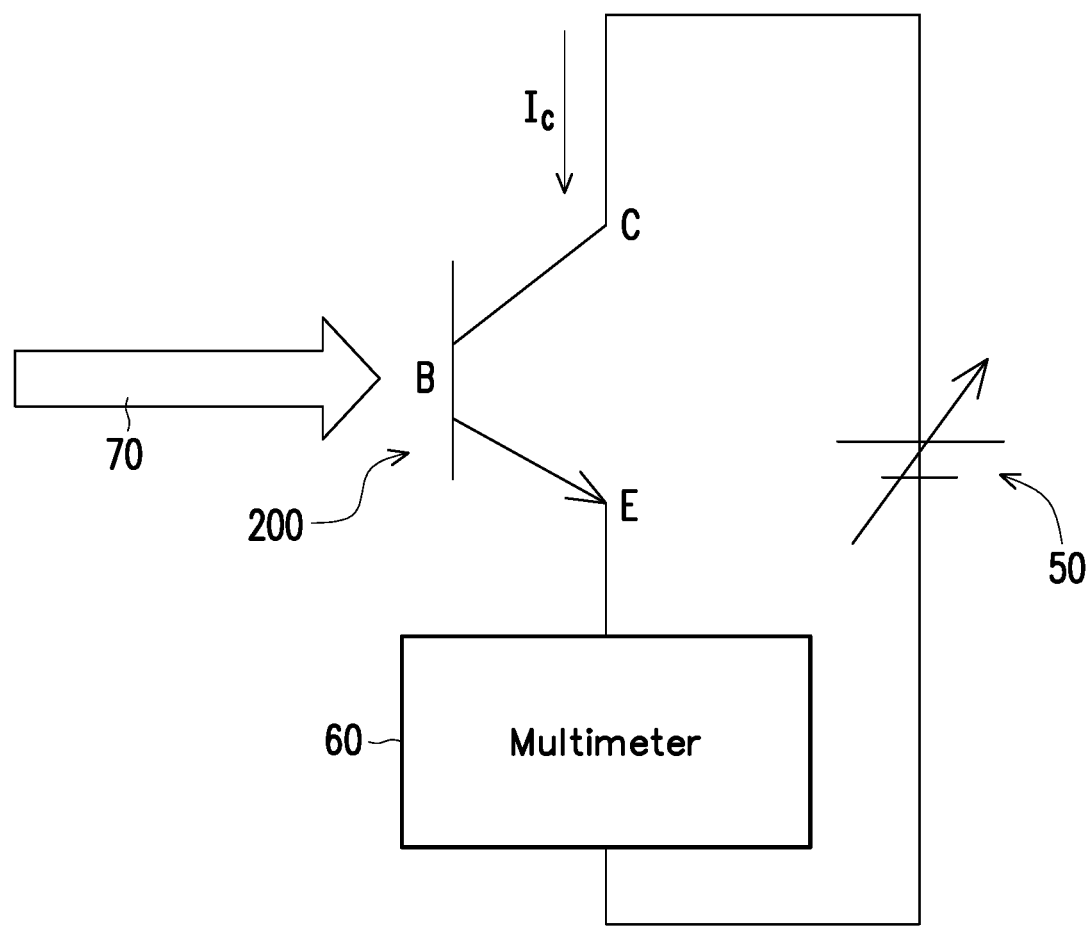
FIG. 2 is a circuit diagram showing the application of the bipolar phototransistor structure in FIG. 1F.

FIG. 2 is a circuit diagram showing the application of the bipolar phototransistor structure in FIG. 1F. Referring to FIG. 1F and FIG. 2, the first n-type semiconductor layer 210 may serve as a collector C of the bipolar phototransistor structure 200, the p-type semiconductor layer 242 may serve as a base B of the bipolar phototransistor structure 200, and the second n-type semiconductor layer 250 may serve as an emitter E of the bipolar phototransistor structure 200. A voltage bias 50 may be applied between the collector C and the emitter E. When a light 70 irradiates the first quantum well layer 220, a photocurrent flows from the base B to the emitter E, which causes an amplified current, i.e. a collector current $I_C$, to flow from the collector C to the emitter E through the base B. At this time, when a multimeter 60 is coupled to the emitter E, the amplified current may be measured.

In the manufacturing method of the optoelectronic semiconductor structure 100 in this embodiment, since the n-type dopant is diffused into the top of the first p-type semiconductor layer 240 to convert the top of the first p-type semiconductor layer 240 into the second n-type semiconductor layer 250, the optoelectronic semiconductor structure 100 having the bipolar phototransistor structure 200 may be formed from a light-emitting diode or photodiode structure so as to reduce the cost of the optoelectronic semiconductor structure 200, and the bipolar phototransistor structure 200 may be formed so as to achieve high responsivity to light.

The optoelectronic semiconductor structure 100 in this embodiment has two n-type semiconductor layers, a p-type semiconductor layer therebetween, and a quantum well layer to form the bipolar phototransistor structure 200, so that the optoelectronic semiconductor structure 100 can have high responsivity to light. Moreover, the optoelectronic semiconductor structure 100 in this embodiment adopts the second n-type semiconductor 250, and the concentration of the n-type dopant in the second n-type semiconductor layer 250 is greater than the concentration of the p-type dopant in the second n-type semiconductor layer 250, so that the optoelectronic semiconductor structure 100 having the bipolar phototransistor structure 200 may be formed from a light-emitting diode or photodiode structure. Therefore, the optoelectronic semiconductor structure 100 in this embodiment has a low cost.

Moreover, since the bipolar phototransistor structure 200 and a light-emitting diode structure (i.e. the light-emitting diode or photodiode structure 300) are monolithically integrated on the substrate 110, the optoelectronic semiconductor structure 100 may serve as a monolithically integrated optical transceiver. However, in other embodiments, the first semiconductor stack 201 is formed on the substrate 110, but the second semiconductor stack 301 is not formed; then, the bipolar phototransistor structure 200 is formed from the first semiconductor stack, and the optoelectronic semiconductor structure includes the bipolar phototransistor structure 200 but does not include the light-emitting diode or photodiode structure 300; that is, the optoelectronic semiconductor structure is a bipolar phototransistor.

In the optoelectronic semiconductor structure 100 in this embodiment, since the p-type electron blocking layer 230 has deep level traps, the electron flow is not blocked by the p-type electron blocking layer 230 due to the occurrence of trap assisted tunneling. As a result, the collector current $I_C$ is enhanced, so that the responsivity of the bipolar phototransistor structure 200 is further increased.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. An optoelectronic semiconductor structure comprising:
a first n-type semiconductor layer;
a first quantum well layer disposed on the first n-type semiconductor layer;
a first p-type semiconductor layer disposed on the first quantum well layer;
a second n-type semiconductor layer disposed on the first p-type semiconductor layer, wherein the second n-type semiconductor layer comprises both an n-type dopant and a p-type dopant; concentration of the n-type dopant in the second n-type semiconductor layer is greater than concentration of the p-type dopant in the second n-type semiconductor layer; the first n-type semiconductor layer, the first quantum well layer, the first p-type semiconductor layer, and the second n-type semiconductor layer form a bipolar phototransistor structure;
a third n-type semiconductor layer disposed on a substrate;
a second quantum well layer disposed on the third n-type semiconductor layer; and
a second p-type semiconductor layer disposed on the second quantum well layer,
wherein the third n-type semiconductor layer, the second quantum well layer, and the second p-type semiconductor layer form a light-emitting diode or photodiode structure; materials of the first n-type semiconductor layer, the first quantum well layer, and the first p-type semiconductor layer of the bipolar phototransistor structure are respectively the same as materials of the third n-type semiconductor layer, the second quantum well layer, and the second p-type semiconductor layer of the light-emitting diode or photodiode structure; the bipolar phototransistor structure and the light-emitting diode or photodiode structure are monolithically integrated on the substrate.

2. The optoelectronic semiconductor structure according to claim 1, wherein the first p-type semiconductor layer further comprises a p-type electron blocking layer disposed right on the first quantum well layer, wherein the p-type electron blocking layer in a region beneath the second n-type semiconductor layer has deep level traps.

3. The optoelectronic semiconductor structure according to claim 1, wherein the first n-type semiconductor layer, the first quantum well layer, the first p-type semiconductor layer, and the second n-type semiconductor layer are made of nitride.

4. The optoelectronic semiconductor structure according to claim 1 further comprising:
   a first electrode disposed on the second n-type semiconductor layer; and
   a second electrode electrically connected to the first n-type semiconductor layer.

5. The optoelectronic semiconductor structure according to claim 1 further comprising a substrate, wherein the first n-type semiconductor layer, the first quantum well layer, the first p-type semiconductor layer, and the second n-type semiconductor layer are stacked on the substrate in sequence.

6. The optoelectronic semiconductor structure according to claim 1, wherein a top surface of the first p-type semiconductor layer is higher than a top surface of the second n-type semiconductor layer with respect to the first quantum well layer.

* * * * *